(12) United States Patent
Sakamoto et al.

(10) Patent No.: US 9,297,589 B2
(45) Date of Patent: Mar. 29, 2016

(54) BOILING HEAT TRANSFER DEVICE

(75) Inventors: Hitoshi Sakamoto, Tokyo (JP); Minoru Yoshikawa, Tokyo (JP); Takeya Hashiguchi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 1221 days.

(21) Appl. No.: 13/128,740

(22) PCT Filed: Oct. 22, 2009

(86) PCT No.: PCT/JP2009/005577
§ 371 (c)(1),
(2), (4) Date: May 11, 2011

(87) PCT Pub. No.: WO2010/058520
PCT Pub. Date: May 27, 2010

(65) Prior Publication Data
US 2011/0214840 A1    Sep. 8, 2011

(30) Foreign Application Priority Data
Nov. 18, 2008    (JP) .................................. 2008-294282

(51) Int. Cl.
*F28D 15/00*    (2006.01)
*F28D 15/02*    (2006.01)
*H01L 23/427*    (2006.01)

(52) U.S. Cl.
CPC .......... *F28D 15/0266* (2013.01); *H01L 23/427* (2013.01); *H01L 2924/0002* (2013.01)

(58) Field of Classification Search
CPC .......................... F28D 15/0266; H01L 23/427
USPC ......... 165/104.21, 104.33; 361/677, 696, 697
See application file for complete search history.

(56) References Cited

U.S. PATENT DOCUMENTS 5,349,831 A * 9/1994 Daikoku ............... H01L 23/427
165/80.4
5,940,270 A * 8/1999 Puckett ........................ 361/699
(Continued)

FOREIGN PATENT DOCUMENTS

JP    S54-038771 A    3/1979
JP    54-158871 A    12/1979
(Continued)

OTHER PUBLICATIONS

International Search Report for PCT/JP2009/005577 mailed Jan. 26, 2010.
(Continued)

*Primary Examiner* — Marc Norman
*Assistant Examiner* — Jon T Schermerhorn

(57) ABSTRACT

A boiling heat transfer device of the present invention includes: a heat receiving portion that boils a liquefied refrigerant to convert it to vapor, and contacts with a device to be cooled and cools the device to be cooled; a vapor tube that connects to an upper portion of the heat receiving portion and conveys the vapor generated by the heat receiving portion; a heat dissipating portion that condenses the vapor conveyed from the vapor tube to convert it to a liquefied refrigerant and dissipates heat to an atmosphere; and a liquid tube that returns to the heat receiving portion the liquefied refrigerant condensed by the heat dissipating portion. At least a portion of a cross-sectional area of a flow passage of the vapor in the heat receiving portion gradually decreases from a lower portion of the heat receiving portion toward the upper portion of the heat receiving portion.

14 Claims, 14 Drawing Sheets

(56) References Cited

U.S. PATENT DOCUMENTS

| | | | |
|---|---|---|---|
| 6,608,752 B2* | 8/2003 | Morris et al. | 361/700 |
| 2003/0062151 A1* | 4/2003 | Sauciuc et al. | 165/185 |
| 2004/0100771 A1* | 5/2004 | Luo | 361/700 |
| 2005/0257917 A1* | 11/2005 | East et al. | 165/104.26 |
| 2010/0147492 A1* | 6/2010 | Conry | F28D 15/0266 165/104.19 |

FOREIGN PATENT DOCUMENTS

| | | |
|---|---|---|
| JP | S63-128737 A | 6/1988 |
| JP | 4-8443 A | 1/1992 |
| JP | H04-028983 A | 1/1992 |
| JP | H04-082856 U | 7/1992 |
| JP | H04-322453 A | 11/1992 |
| JP | H06-275749 A | 9/1994 |
| JP | 2000183259 A | 6/2000 |
| JP | 2001094023 A | 4/2001 |
| JP | 2002168547 A | 6/2002 |
| JP | 2003166793 A | 6/2003 |
| JP | 2004056121 A | 2/2004 |
| JP | 2005195226 A | 7/2005 |
| JP | 2007010211 A | 1/2007 |
| JP | 2007-150203 A | 6/2007 |
| JP | 2008130746 A | 6/2008 |
| JP | 2009088125 A | 4/2009 |
| WO | 2010/058520 A1 | 5/2010 |

OTHER PUBLICATIONS

Japanese Office Action for JP Application No. 2014-163887 mailed on Oct. 27, 2015 with English Translation.

* cited by examiner

BOILING HEAT TRANSFER DEVICE

TECHNICAL FIELD

The present invention relates to a boiling heat transfer device for cooling a semiconductor device and electronic devices, and in particular to a boiling heat transfer device that circulates a refrigerant by utilizing the gas-liquid phase transition phenomenon.

BACKGROUND ART

In order to dissipate a large quantity of heat that is generated in a semiconductor device or electronic devices, a method has been developed to obtain a high cooling performance by bringing a heat absorber into contact with such heat generating devices, and flowing a refrigerant inside of the heat absorber. By boiling the refrigerant with the heat absorber, it is possible to obtain a higher cooling effect. As a method of circulating the refrigerant between the heat absorbing portion and the heat dissipating portion, traditionally a method that employs a pump was generally used. In the case of a boiling heat transfer device, a thermal siphon-type cooling structure has been proposed that, by installing a heat absorbing portion in the lower part of the cooler and a heat dissipating portion above the cooler, does not required a pump by employing the principle of vapor collecting upward with respect to the direction of gavity due to the difference in density between the vapor that is generated and the liquid (for example, refer to Patent Documents 1 to 5).

The boiling heat transfer device that is disclosed in Patent Document 1 has a thin-type refrigerant bath whose planar shape is almost trapezoidal, with a boiling space provided within. The portion that comes into contact with a heat generator (computer chip) is provided on the bottom surface of the refrigerant bath, and a vapor side header tank and a liquid side header tank that extend from the refrigerant tank in a perpendicular direction and are continuous with the interior space of the refrigerant tank are provided on the upper surface of the refrigerant tank. Both header tanks are connected by a plurality of heat dissipating tubes. Heat dissipating fins are installed between the heat dissipating tubes. In this boiling heat transfer device, the portion of the refrigerant tank that is in contact with the heat generator is provided along the upper base of the trapezoid shape, and the connection portion between the gas side/liquid side header tanks of the refrigerant tank is provided near the end portions on the lower base of the trapezoid shape.

Patent Document 2 discloses a CPU cooling device that leads refrigerant vapor from a vaporizer that is in contact with a CPU, which is a heat generator, to a condenser via a vapor flow passage, and returns the refrigerant that has been liquefied in the condenser to the vaporizer via a liquid flow passage. In the cooling device, a zigzagging pipe that is provided in a manner connected to the heat dissipating fins is installed in the condenser. The vapor from the vapor flow passage flows in from the inflow portion of the pipe, and refrigerant liquid from the outflow portion of the pipe to the liquid flow passage flows out.

Patent Document 3 discloses a thermo-siphon type heat transfer body. The space between a heat absorbing side header block and a heat radiating side header block, in which X-direction coolant channels and Y-direction coolant channels are respectively formed, is connected by a plurality of coolant tubes. Corrugated fins are provided between the coolant tubes. In this thermo-siphon type heat transfer body, the heat absorbing side header block is disposed on the lower side, and the heat radiating side header block is disposed on the upper side, and a semiconductor element is closely attached to the undersurface of the heat absorbing side header block.

Patent Document 4 discloses a liquid cooling system. A radiator is provided in a storage container in which a heat exchange circulating solution and vapor thereof are stored. Moreover, a solution delivery port and a gas-liquid two-phase fluid feeding port of the storage container are coupled by a pipe of which a portion passes through the storage container. The pipe has a solution delivery pipe portion that is coupled to the solution delivery port and enters the storage container, an in-container pipe portion that is in the storage container, and a gas-liquid two-phase fluid feeding pipe portion that comes out from the storage container and is coupled to the gas-liquid two-phase fluid feeding port. A heating heat exchanger that acts as a radiator for a heat-generating body such as an electronic device is provided in the gas-liquid two-phase fluid feeding pipe portion.

Patent Document 5 discloses a cooling device that is an integrated thermosiphon in which a heat receiving portion and a heat dissipating portion are mounted in the same housing. A plurality of condenser tubes are arranged above the boiler plate, with a plurality of pyramid-shaped fins formed on the surface. Vapor chambers are constituted between the condenser tubes and the boiler plate. In this cooling device, the condenser tubes are sandwiched by revolving fins for heat dissipation. The vapor that is produced in the vapor chambers rises up through the condenser tubes, and is liquefied on the walls thereof.

PRIOR ART DOCUMENTS

Patent Documents

[Patent Document 1] Japanese Unexamined Patent Application, First Publication No. 2000-183259 (FIG. 1 to FIG. 3)
[Patent Document 2] Japanese Unexamined Patent Application, First Publication No. 2002-168547 (FIG. 1)
[Patent Document 3] Japanese Unexamined Patent Application, First Publication No. 2003-166793 (FIG. 1 to FIG. 5)
[Patent Document 4] Japanese Unexamined Patent Application, First Publication No. 2005-195226 (FIG. 1)
[Patent Document 5] Japanese Unexamined Patent Application, First Publication No. 2004-056121 (FIG. 1 to FIG. 4)

SUMMARY OF THE INVENTION

Problem to be Solved by the Invention

In the cooling devices that are disclosed in Patent Documents 1 and 2, a vapor flow passage and a liquid flow passage are installed nearly vertical to the ceiling of the refrigerant tank, which has a thin shape and whose ceiling is level. En such a construction, it is difficult to effectively utilize the momentum of the vapor that is produced in the refrigerant tank to collect it in the vapor flow passage, and so there is the problem of the vapor easily stagnating in the refrigerant tank, and the pressure loss increasing. Also, when the vapor flows vertically upward through the vapor flow passage, the liquid phase refrigerant that has condensed on the way tends to move downward in opposition to the vapor flow due to gravity. As a result, the pressure loss increases for the vapor flow, and the pressure difference increases between the top and bottom of the vapor flow passage, and thereby the temperature difference between the top and bottom of the vapor flow passage increases, leading to a drop in performance of the cooler. In a structure in which the vapor flow passage and the liquid flow passage open onto the same plane of the refrigerant tank, in other words, in a structure in which the liquid flow passage opens onto the vapor space of the refrigerant tank, the vapor also advances to the liquid flow passage side, and thus advances in the opposite direction to the liquid that is flowing down the liquid flow passage, and so smooth flow of the cooling liquid is obstructed.

Such a problem similarly occurs in the cooling device that is disclosed in Patent Document 3, in which a heat absorbing side header block and a heat radiating side header block are connected by coolant tubes. In the cooling device that is disclosed in Patent Document 3, although equalization of the vapor that flows into each coolant tube is attempted by providing coolant channels in a direction perpendicular to the header blocks, in a structure where separation of the vapor and the liquid is not performed, it is not a fundamental solution. The aforementioned problem due to vapor and liquid flowing in mutually opposing directions is not considered to occur in the cooling device of Patent Document 4, in which the flow directions of the vapor and the refrigerant solution are the same. However, in the cooling device of Patent Document 4, the pipe portion in which only the refrigerant solution flows and the pipe portion through which a refrigerant solution that includes a large quantity of vapor are constituted by tubing of the same thickness, and the transport capacity of the refrigerant changes greatly depending on the portion of the pipe. For this reason, resistance arises in the circulation of vapor after all, and there is a possibility that the smooth circulation of vapor may be impeded. Also, although many of the components that are cooled are plate shaped, in the cooling device of Patent Document 4, the heat absorbing portion is a pipe body. For this reason, since contact between the heat absorbing portion of the cooling device and the component being cooled is not surface contact, thermal resistance therebetween increases, and so it becomes difficult to perform efficient cooling.

The aforementioned problem of vapor pressure loss does not occur in the structure disclosed in Patent Document 5 in which an evaporating portion and a condensing portion are unified. Due to it having a condensing portion directly above the evaporation surface, circulation of the refrigerant between the evaporating portion and the condensing portion is performed efficiently. However, the manufacture of an integrated constitution is difficult and costly, and such a constitution is flawed in terms of efficient heat dissipation as described below.

If the boiling heat transfer device that is used for cooling of an electrical component (heat generating body) can radiate heat in the vicinity of the component, the possibility of being able to minimize the pressure loss increases from the standpoint of circulation of the refrigerant. On the other hand, in the case of bring the heat absorbing portion and heat dissipating portion in close proximity as in the boiling heat transfer device disclosed in Patent Document 5, thermal isolation of the heat absorbing portion and the heat dissipating portion becomes difficult, and so it becomes difficult to efficiently perform heat dissipation from the heat dissipating portion to the outside.

The issue of the present invention is to solve the aforementioned problems of the conventional art, and it has as its object to provide a boiling heat transfer device that is capable of both the functions of increasing the heat dissipation to the outside of the device to the maximum and suppressing the pressure loss of the refrigerant circulation system to a low level, which until now have been regarded as opposing concepts.

Means for Solving the Problem

In order to achieve the aforementioned objects, a boiling heat transfer device according to a first aspect of the present invention includes: a heat receiving portion that boils a liquefied refrigerant to convert it to vapor, and contacts with a device to be cooled and cools the device to be cooled; a vapor tube that connects to an upper portion of the heat receiving portion and conveys the vapor generated by the heat receiving portion; a heat dissipating portion that condenses the vapor conveyed from the vapor tube to convert it to a liquefied refrigerant and dissipates heat to an atmosphere; and a liquid tube that returns to the heat receiving portion the liquefied refrigerant condensed by the heat dissipating portion, and at least a portion of a cross-sectional area of a flow passage of the vapor in the heat receiving portion gradually decreases from a lower portion of the heat receiving portion toward the upper portion of the heat receiving portion.

Also, in order to achieve the aforementioned objects, a boiling heat transfer device according to a second aspect of the present invention includes: a heat receiving portion that boils a liquefied refrigerant to convert it to vapor, and contacts with a device to be cooled and cools the device to be cooled; a vapor tube that conveys the vapor generated by the heat receiving portion; a heat dissipating portion that condenses the vapor conveyed from the vapor tube to convert it to a liquefied refrigerant and dissipates heat to an atmosphere; and a liquid tube that returns to the heat receiving portion the liquefied refrigerant condensed by the heat dissipating portion, and the vapor tube is drawn out from the heat receiving portion side in a parallel direction to a direction of gravity, and is bent in a direction close to horizontal toward the heat dissipating portion.

Effect of the Invention

The first effect of an exemplary embodiment of the present invention is to be able to reduce to the utmost the pressure loss of the circulation system of an entire boiling heat transfer device.

The second effect of the exemplary embodiment of the present invention is to be able to prevent back flow of the condensed refrigerant in the vapor tube while making use of the advantage of the decoupled system in which direct heat dissipation is possible with respect to outside of the cooling apparatus by separating the heat dissipating portion from the heat receiving portion in a decoupled boiling heat transfer device that separates the heat receiving portion and the heat dissipating portion.

EMBODIMENTS FOR CARRYING OUT THE INVENTION

Next, exemplary embodiments of the present invention shall be described in detail with reference to the drawings.

[First Exemplary Embodiment]

Figure 1:
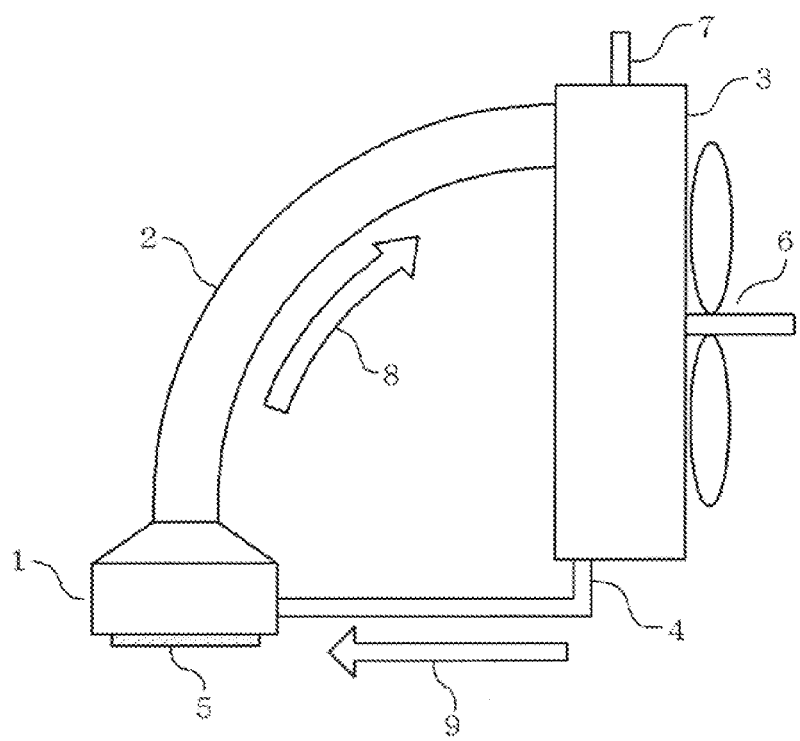
FIG. 1 is a schematic view that shows a boiling heat transfer device according to a first exemplary embodiment of the present invention.

FIG. 1 is a schematic view that shows a boiling heat transfer device according to a first exemplary embodiment of the present invention. The boiling heat transfer device has a heat receiving portion 1, a vapor tube 2, a heat dissipating portion 3, a liquid tube 4, a cooling fan 6, and a refrigerant pouring inlet 7. The upper portion of the heat receiving portion 1 and the upper portion of the heat dissipating portion 3 are connected by the vapor tube 2. The liquid tube 4 that is drawn out from the bottom of the heat dissipating portion 3 is connected to the side of the heat receiving portion 1. The cover portion of the heat receiving portion 1 has a pyramid shape. The vapor tube 2 that is drawn out vertically from the top of the heat receiving portion 1 is bent in a circular arc and connected to the heat dissipating portion 3 in a horizontal state. That is, the vapor tube 2 has a first end portion that is connected to the heat receiving portion 1 and a second end portion 2 that is connected to the heat dissipating portion 3. The orientation of the center axis of the vapor tube 2 is approximately parallel with respect to the direction of gravity in the vicinity of the first end portion. The orientation of the center axis of the vapor tube 2 is approximately perpendicular to the direction of gravity in the vicinity of the second end portion. The bottom surface of the heat receiving portion 1 is flat. At the bottom surface of the heat receiving portion 1, a heat generating element 5 such as a semiconductor device is arranged in close contact. The refrigerant pouring inlet 7 is provided at the upper portion of the heat dissipating portion 3 for initial filling of the refrigerant and topping up of the refrigerant. The cooling fan 6 for cooling the heat dissipating portion 3 is installed on the side of the heat dissipating portion 3.

The refrigerant boils inside of the heat receiving portion 1 that faces the heat generating element 5, and the vapor that is thereby generated heads to the outlet to the vapor tube 2. The heat receiving portion 1 is formed so that the vapor flow passage gradually narrows toward the vapor tube 2. The vapor tube 2 opens at a position directly above the heat generating element 5. By this structure, the force of the flow of the boiling bubbles is effectively utilized, and so the vapor that is generated at the heat receiving portion 1 is guided to the vapor tube 2 with low resistance. By gently changing the angle of the vapor tube 2, the vapor is carried toward the heat dissipating portion 3 in the direction of the arrow 8. The fact that the vapor tube 2 is connected to the upper side of the condenser 3 is considered to be a good condition for ensuring the performance of the heat dissipating portion 3. The vapor that is guided to the heat dissipating portion 3 flows from the top to the bottom inside of the heat dissipating portion 3, and returns to liquid. The refrigerant that has returned to liquid collects at the bottom of the heat dissipating portion 3, moves through the liquid tube 4 in the direction of the arrow 9, and returns to the heat receiving portion 1.

Figure 2:
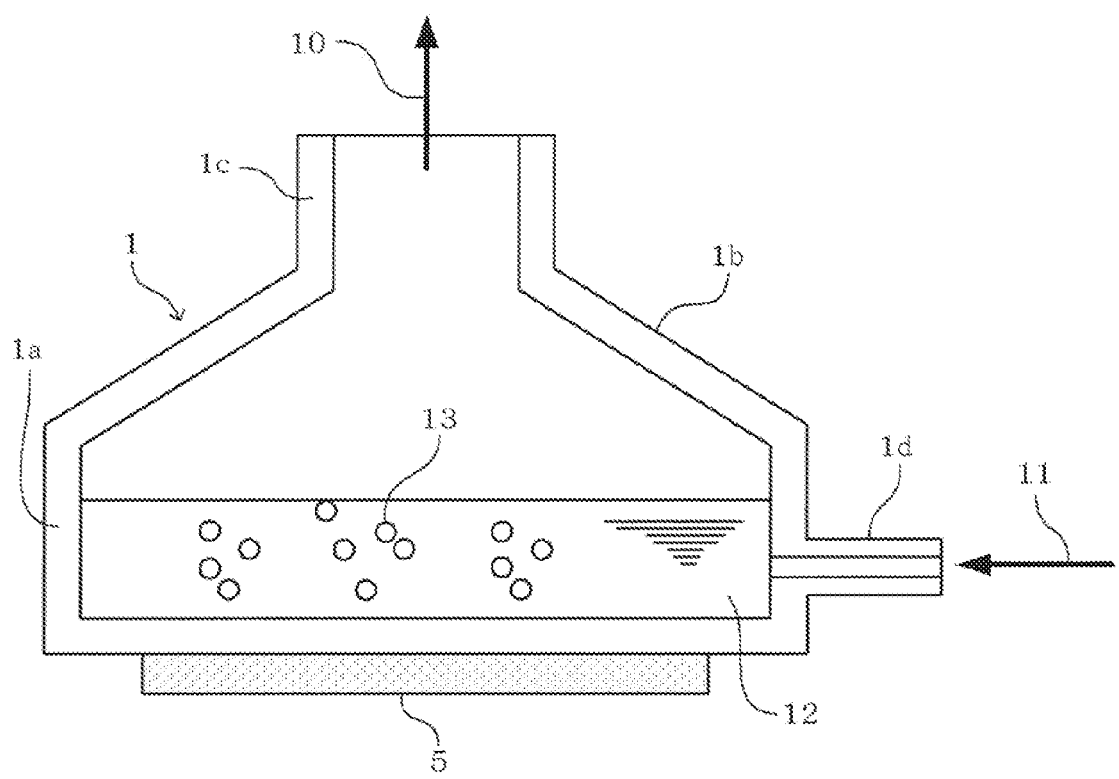
FIG. 2 is a cross-sectional view that shows a heat receiving portion of the first exemplary embodiment of the present invention.

FIG. 2 is a cross-sectional view of the heat receiving portion 1. The heat receiving portion 1 has a main body 1a, a vapor outflow portion 1c, a cover portion 1b, and a condensate inflow portion 1d. The main body portion 1a has a box shape, and the flat surfaces thereof form a square. The cover portion 1b has a pyramid shape, and is provided between the main body portion 1a and the vapor outflow portion 1c. The condensate inflow portion 1d is formed on the side of the main body portion 1a. The liquid phase refrigerant 11 that has returned from the condenser (heat dissipating portion 3) flows in from the side of the heat receiving portion 1 via the condensate inflow portion 1d. A refrigerant liquid 12 collects inside of the heat receiving portion 1. The refrigerant liquid 12 boils from the heat of the heat generating element 5 such as an electronic device that is installed at the bottom of the heat receiving portion 1, and produces boiling bubbles 13. A vapor 10 that is generated flows out to the vapor tube 2 from the vapor outflow portion 1c above. Comparing the tube diameter of the liquid tube 4 for the liquid phase refrigerant and the vapor tube 2 for the vapor phase, the tube diameter of the vapor tube 2 is set to be larger. When the entire cooler is in a steady state, the mass-base flow amount is same everywhere, but the volumetric-base flow amount differs greatly. This is due to the density of the liquid and vapor changing greatly. The small diameter of the liquid tube 4 that is connected to the heat receiving portion 1 has the effect of preventing the mixing in of the vapor. Accordingly, in the present exemplary embodiment, it is most preferred that the heat receiving portion 1 have a structure of being connected with the small-diameter liquid tube 4 that is connected to the side of the heat receiving portion 1 and to the comparatively larger diameter vapor tube 2 that is connected to the upper portion of the heat receiving portion 1. With this structure, in conjunction with the liquid-phase back-flow preventive measure in the vapor tube 2 described below, it is possible to realize without a check valve a system that can prevent back flow or, even if back flow occurs, can suppress to a minimum the effect thereof.

Figure 3A:
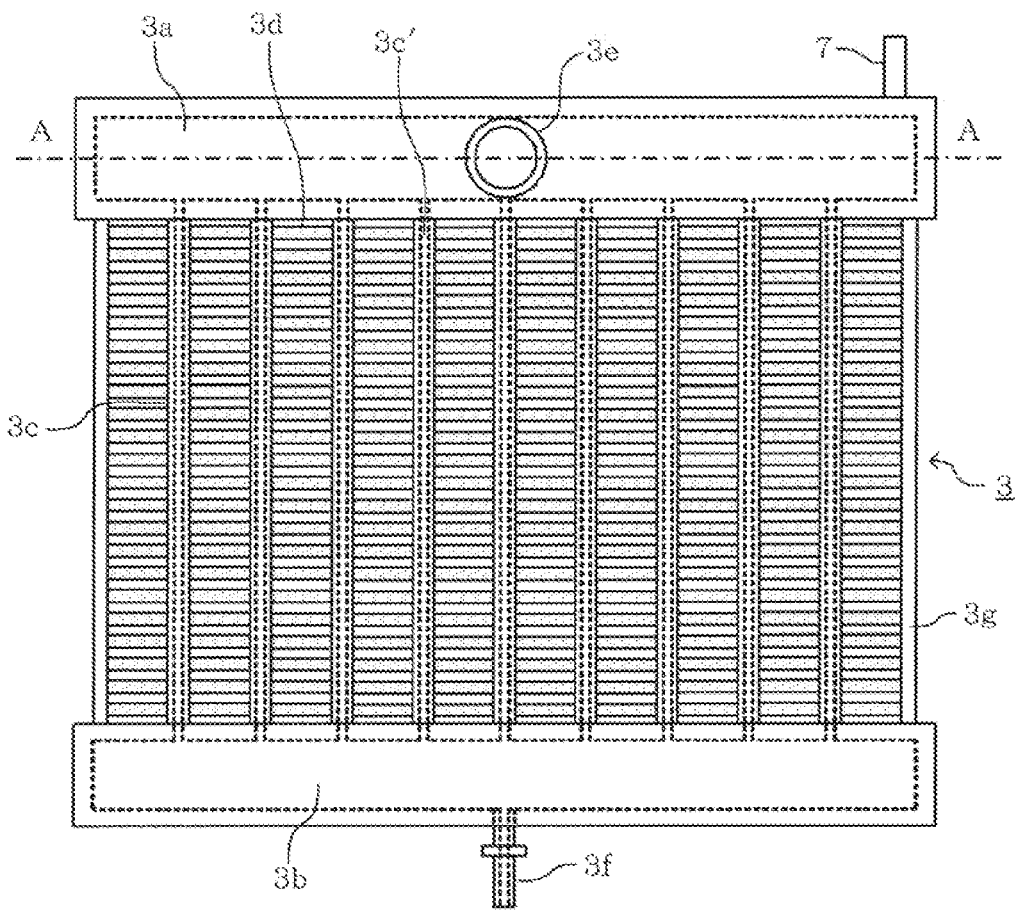
FIG. 3A is a side view that shows a heat dissipating portion of the first exemplary embodiment of the present invention.
Figure 3B:
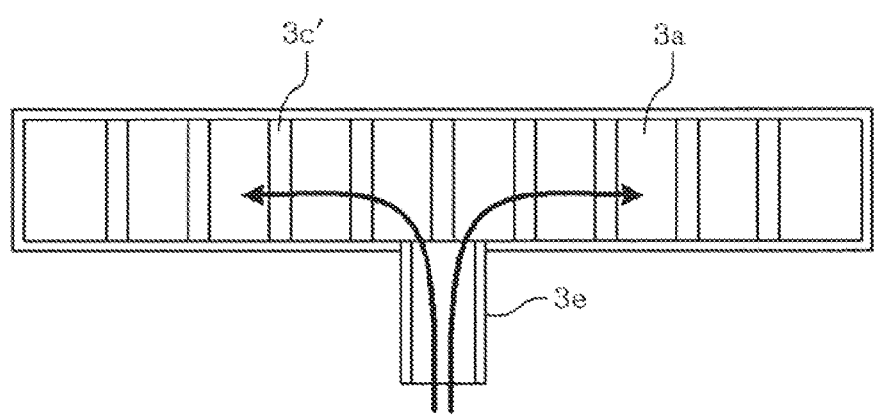
FIG. 3B is a cross-sectional view along line A-A in FIG. 3A.

FIG. 3A is a side view that shows the structure of the heat dissipating portion 3 in the present exemplary embodiment. FIG. 3B is a side view along line A-A in FIG. 3A. The heat dissipating portion 3 has a heat dissipating portion header 3a, a condensate collection portion 3b, vapor-condensate cylinders 3c, vapor-condensate flow passages 3c', heat dissipating fins 3d, a vapor flow inlet 3e, a condensate outlet 3f, and a frame 3g. The vapor flow inlet 3e is fixed to the heat dissipating portion header 3a. The condensate outlet 3f is fixed to the condensate collection portion 3b. The heat dissipating portion header 3a and the condensate collection portion 3b are connected by the vapor-condensate pipe 3c. The vapor-condensate flow passage 3c' is formed inside of the vapor-condensate pipe 3c, and vapor and condensate flow through it. The heat dissipating fin 3d is installed between the frame 3g and the vapor-condensate cylinder 3c, and between the vapor-condensate cylinders 3c.

The vapor that has flowed in from the vapor tube 2 to the heat dissipating portion header 3a via the vapor flow inlet 3e is dispersed to the left and right (that is, in the direction of the arrows in FIG. 3B) upon abutting a surface opposing the surface at which the vapor flow inlet 3e is provided. Thereby, the vapor can be made to spread throughout the entire header 3a. Thereafter, the vapor condenses while passing through the vapor-condensate flow passages 3c'. At this time, the liquefied refrigerant heads toward the condensate collection portion 3b due to gravity. The vapor-condensate pipes 3c make contact with the heat dissipating fins 3d, and so heat is dissipated to the atmosphere by the air that passes between the fins 3d. Condensation is performed on the inner wall of the vapor-condensate flow passages 3e'. An effect of promoting the operation is achieved when the flow passage inner wall is hindered from being covered by a condensate film. As one method of doing so, a method is conceivable that involves applying a water repellent treatment to the inner wall surface, but its effectiveness with respect to a refrigerant that has a high wetness is not high. For that reason, one of the best methods is to form the refrigerant flow passage in a state close to vertical, and discharge the refrigerant to the condensate collection portion 3b using gravity. The refrigerant pouring inlet 7 is provided in the heat dissipating portion 3. When pouring in the refrigerant, it is necessary to remove noncondensable gas in the boiling heat transfer device at the same time. Since gas has a lower density compared to the refrigerant liquid, it is necessary to suction it from above in the direction of gravity. Where to install this refrigerant pouring inlet 7 therefore becomes an issue. 1t is optimal to install the refrigerant pouring inlet 7 at a position that exerts little effect on the refrigerant circulation after sealing the boiling heat transfer device. Therefore, when the refrigerant pouring inlet 7 is provided in a corner portion of the heat dissipating portion header 3a, exhaust of the noncondensable gas can be effectively performed, and it is possible to minimize the effect exerted on the flow of the vapor after sealing.

Figure 4A:
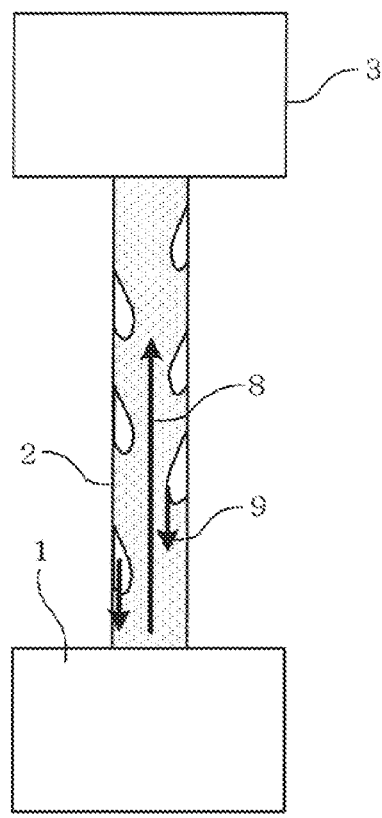
FIG. 4A is a view that shows a typical vertical-type vapor tube that connects a heat receiving portion and a heat dissipating portion.
Figure 4B:
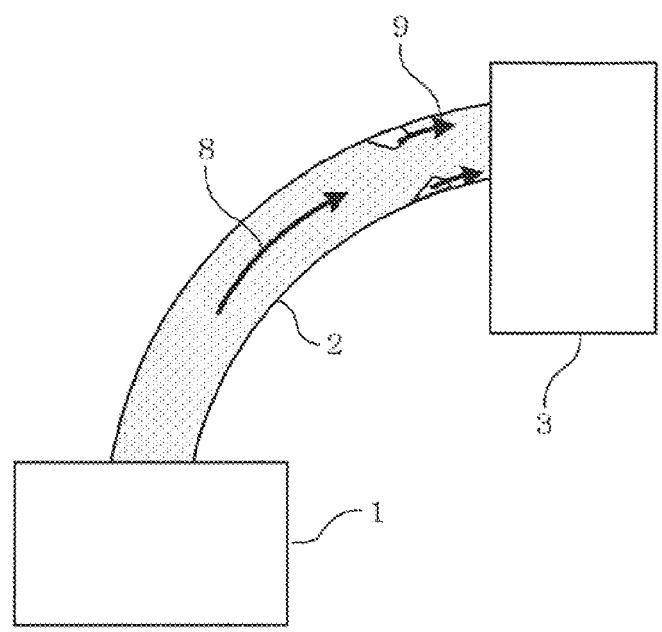
FIG. 4B is view that shows a horizontal transition-type vapor tube that connects the heat receiving portion and the heat dissipating portion in the first exemplary embodiment of the present invention.

Referring to FIG. 4A and FIG. 4B, the action/effect of the vapor tube 2 that is used in the present exemplary embodiment being bent in the horizontal direction after being drawn out in the vertical direction shall be described. FIG. 4A shows the method generally used to connected the heat receiving portion 1 and the heat dissipating portion 3 with the vertical vapor tube 2. As shown in FIG. 4A, since the vapor tube 2 is entirely arranged vertically, by utilizing the lift of the vapor, it is considered possible to cause the vapor to efficiently move along the arrow 8 that shows the vapor flow direction until the heat dissipating portion 3 (condenser portion). Also, since the vapor tube 2 is not bent, there is the appeal of the pressure loss caused by that being small. However, the vapor that comes into contact with the inner wall of the vapor tube 2 may condense, and the refrigerant that thus liquefies starts to flow downward along the inner wall in the direction of the arrow 9, and tries to return to the heat receiving portion 1. At this time, since it flows in the opposite direction to the flow of the vapor, resistance arises for both the vapor and the condensate. As a result, the pressure loss for the vapor increases, there is the risk of a large pressure loss inducing more condensation in the tube. Accordingly, there is the fear of the flow of the system becoming unstable in the case of a lot of vapor being produced in a high heat generation state. Next, as shown in FIG. 4B, a method of connecting the heat receiving portion 1 and the heat dissipating portion 3 by the vapor tube 2 having the shape of a circular arc (horizontal transition-type) shall be considered. When considering the case of the length of the vapor tube 2 being equivalent so that the pressure loss in the state of condensation not occurring being the same in order to compare with the case of the vertical-type vapor tube 2, there is a possibility of condensation itself occurring within the horizontal transition-type vapor tube 2 shown in FIG. 4B. However, the vapor tube 2 has a structure in which the latter half (the heat dissipating portion 3 side of the vapor tube 2) extends in a state close to horizontal. For this reason, even in the case of a portion of the vapor having condensed in the latter half of the vapor tube 2, the liquefied refrigerant is pushed by the vapor flow that moves in the direction of arrow 8 and thereby sent to the condenser in the direction of the arrow 9, so that its return to the vaporizing portion is eliminated. At the same temperature, condensation more readily occurs at a lower pressure. Inside of the vapor tube 2, since the pressure decreases from the entrance on the side of the heat receiving portion 1 to the exit on the side of the heat dissipating portion 3 due to the flow, condensation usually begins from close to the exit. For that reason, preventing back flow of the liquid phase that condenses near the exit of the vapor tube 2 greatly contributes to stable operation of the system.

[Second Exemplary Embodiment]

Figure 5A:
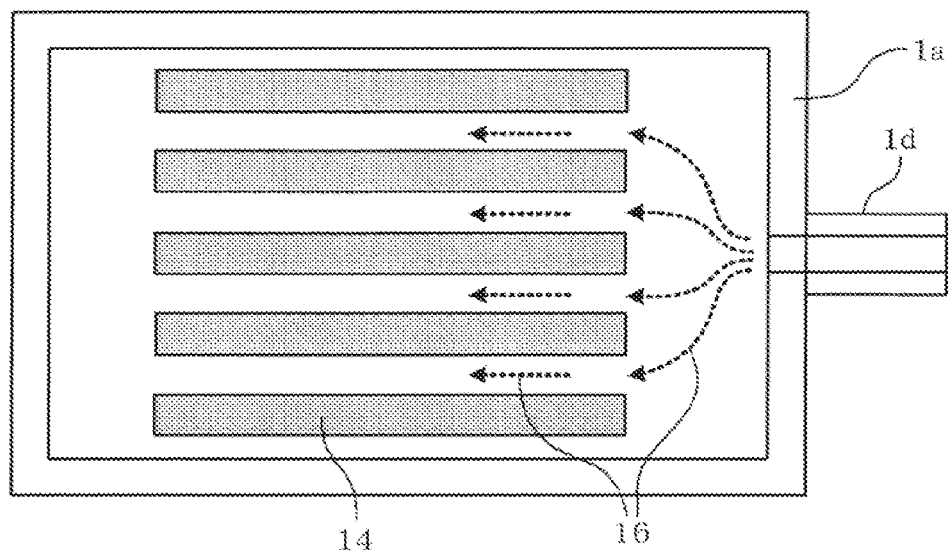
FIG. 5A is a transverse cross-sectional view that shows a heat receiving portion of a second exemplary embodiment of the present invention.
Figure 5B:
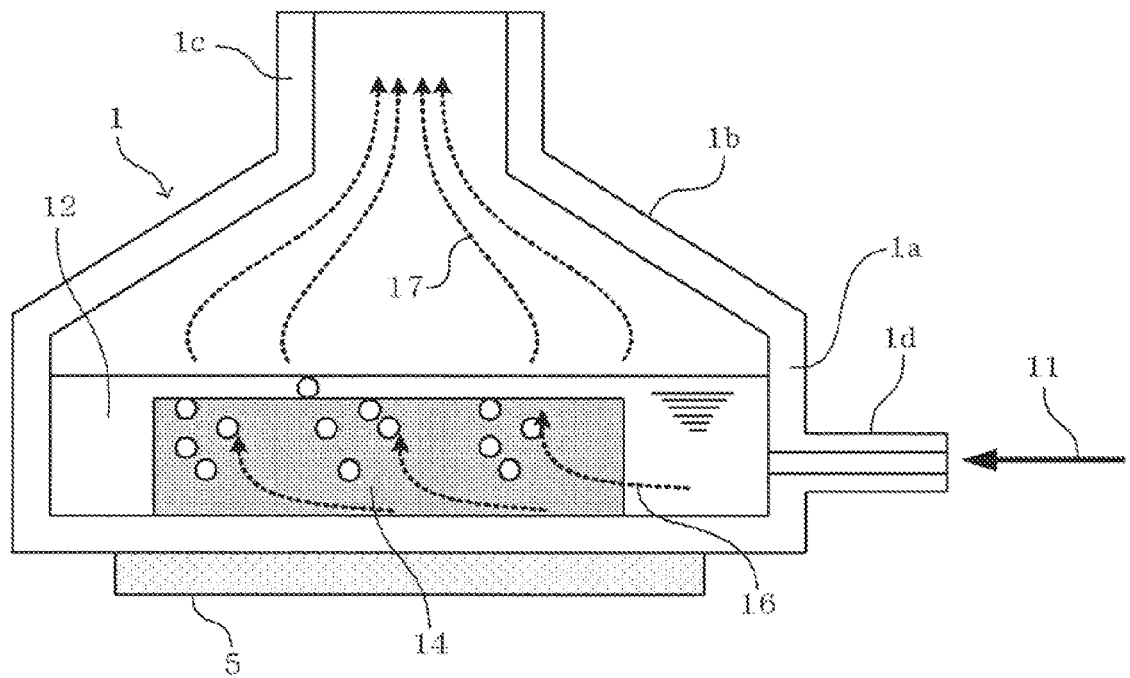
FIG. 5B is a vertical cross-sectional view that shows the heat receiving portion of the second exemplary embodiment of the present invention.

FIG. 5A is a transverse cross-sectional view that shows a heat receiving portion of a second exemplary embodiment of the present invention. FIG. 5B is a vertical cross-sectional view that shows the heat receiving portion of the second exemplary embodiment of the present invention. In the heat receiving portion shown in FIG. 5A and FIG. 5B, the same reference symbols are given to the same locations as the heat receiving portion of the first exemplary embodiment shown in FIG. 2, and so overlapping descriptions are omitted. In the present exemplary embodiment, a plurality of boiling promotion fins (also called boiling promotion plates, or simply fins) 14 are provided on the inside bottom surface of the main body portion 1a of the heat receiving portion 1. Thereby, it is possible to increase the contact surface area to the liquid phase of the boiling surface, and it is possible to raise the efficiency of heat reception. The arrows 16 show the direction of the liquid flow. The arrow 17 shows the direction of the vapor flow. After the liquid-phase refrigerant 11 has flown in to the heat receiving portion 1, it flows in between the boiling promotion fins 14 that are formed along the flow as shown by the arrows 16. Also, since the boiling promotion fins 14 are provided, flows of the refrigerant between the boiling promotion fins 14 are formed. Also, during the rise of the boiling bubbles, the bubbles flow between the boiling promotion fins 14 with vigor, and so the heat transmission is promoted by the convective effect.

[Third Exemplary Embodiment]

Figure 6A:
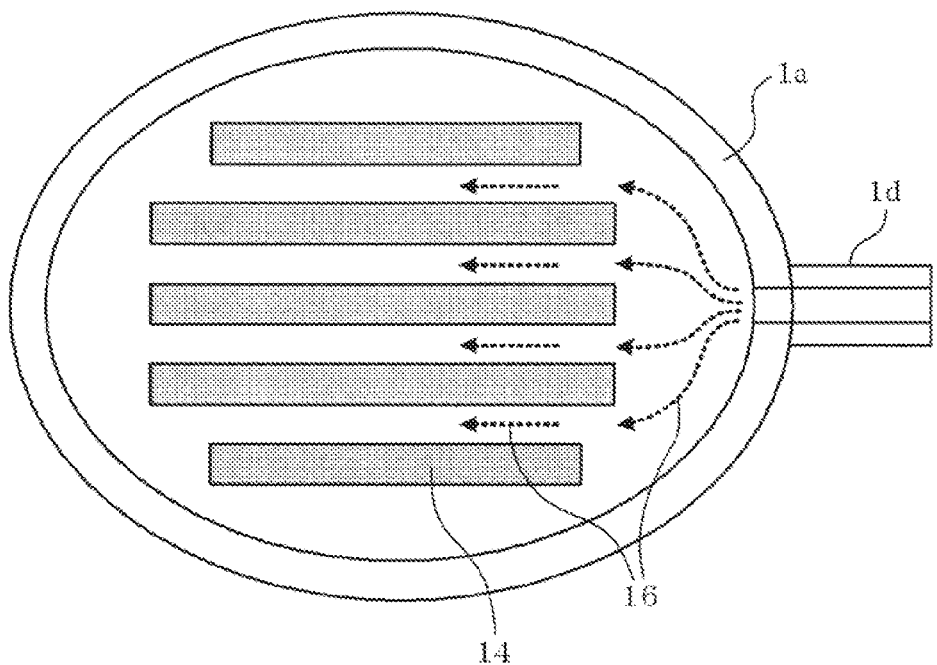
FIG. 6A is a transverse cross-sectional view that shows a heat receiving portion of a third exemplary embodiment of the present invention.
Figure 6B:
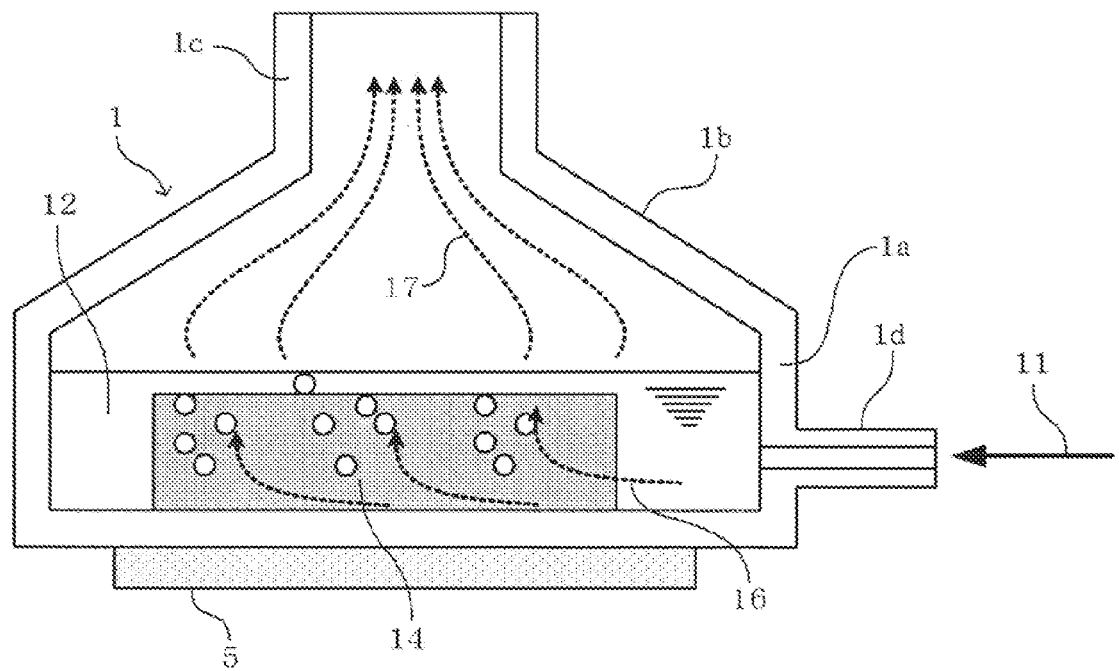
FIG. 6B is a vertical cross-sectional view that shows the heat receiving portion of the third exemplary embodiment of the present invention.

FIG. 6A is a transverse cross-sectional view that shows a heat receiving portion of a third exemplary embodiment of the present invention. FIG. 6B is a vertical cross-sectional view that shows the heat receiving portion of the third exemplary embodiment of the present invention. In the heat receiving portion shown in FIG. 6A and FIG. 6B, the same reference symbols are given to the same locations as the heat receiving portion of the second exemplary embodiment shown in FIG. 5A and FIG. 5B, and so overlapping descriptions are omitted. In the present exemplary embodiment, as shown in FIG. 6A, the planar shape of the heat receiving portion 1 is oval. Since the main body portion 1a of the heat receiving portion 1 has an oval shape, the cover portion 1b has the shape of an elliptical truncated cone. Due to the heat receiving portion 1 having an oval shape, the flow of the vapor is smoother. The planar shape of the heat receiving portion 1 may be circular instead of oval, and it is possible to select a suitable shape in accordance with the shape of the heat generating element 5 that is to be cooled.

[Fourth Exemplary Embodiment]

Figure 7:
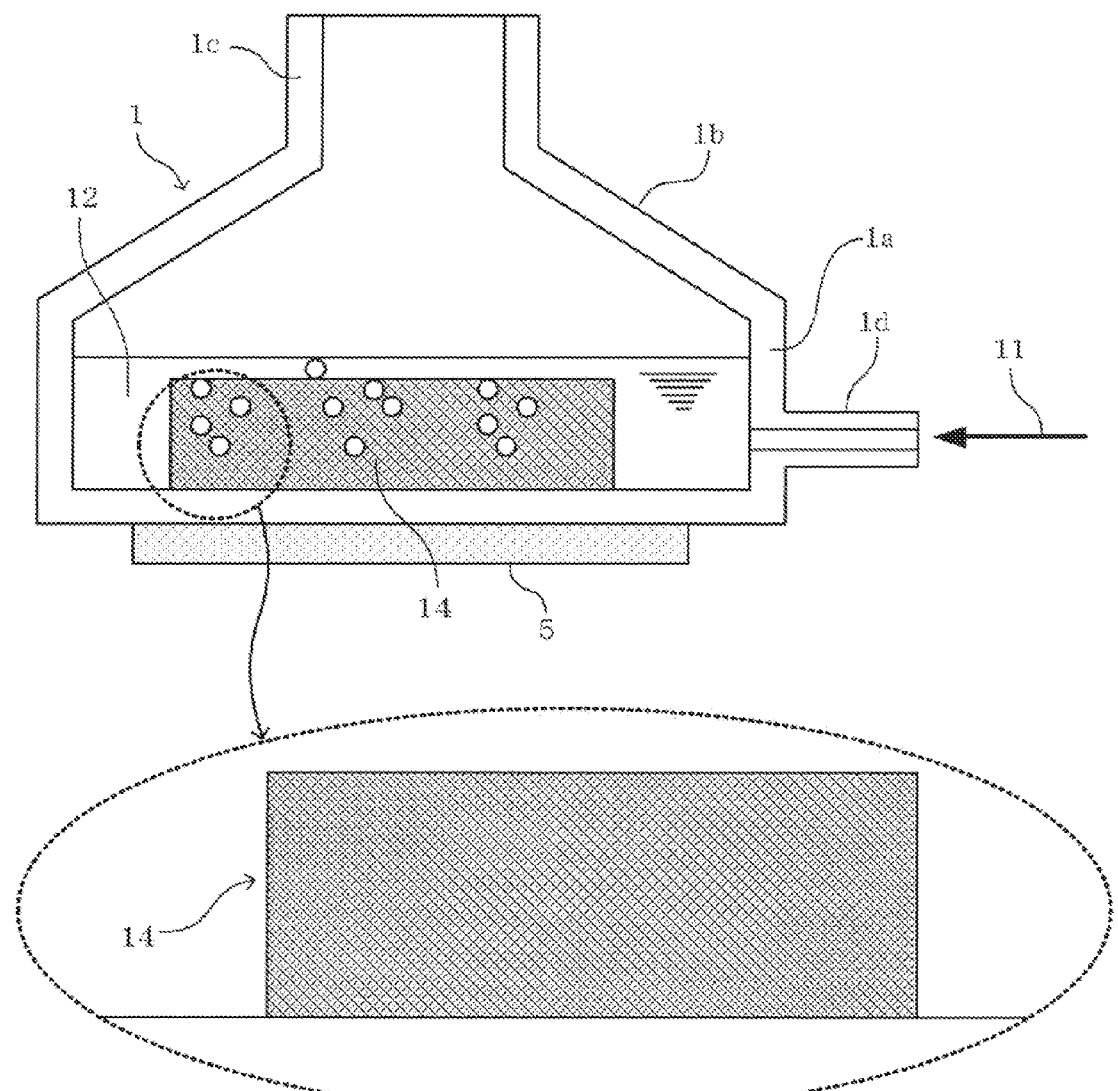
FIG. 7 is a cross-sectional view that shows a heat receiving portion of a fourth exemplary embodiment of the present invention.
Figure 8:
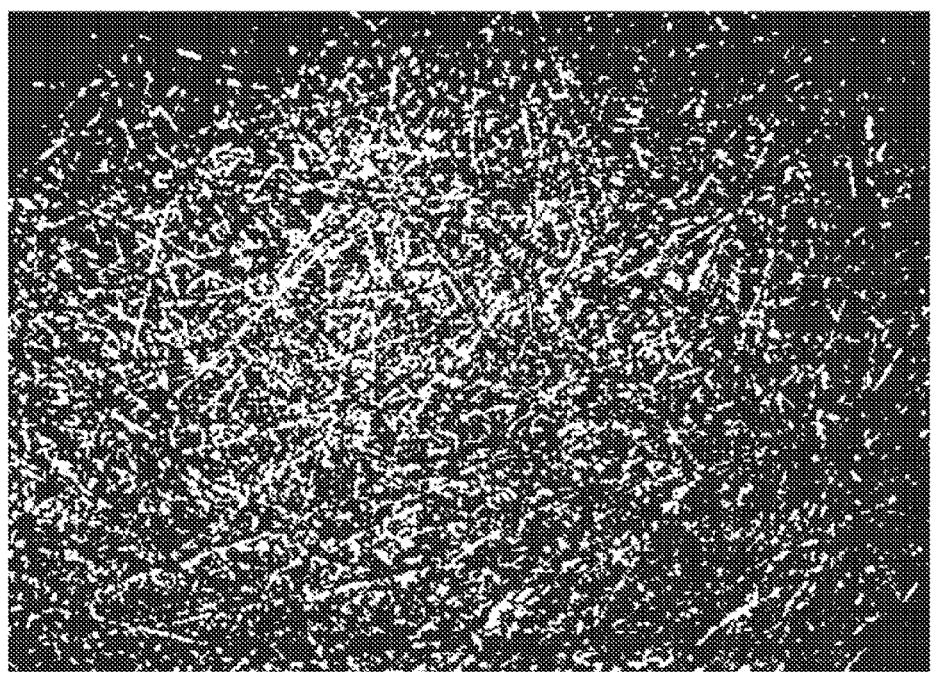
FIG. 8 is a view that shows an example of a porous material that is used in the heat receiving portion of the fourth exemplary embodiment of the present invention.
Figure 9:
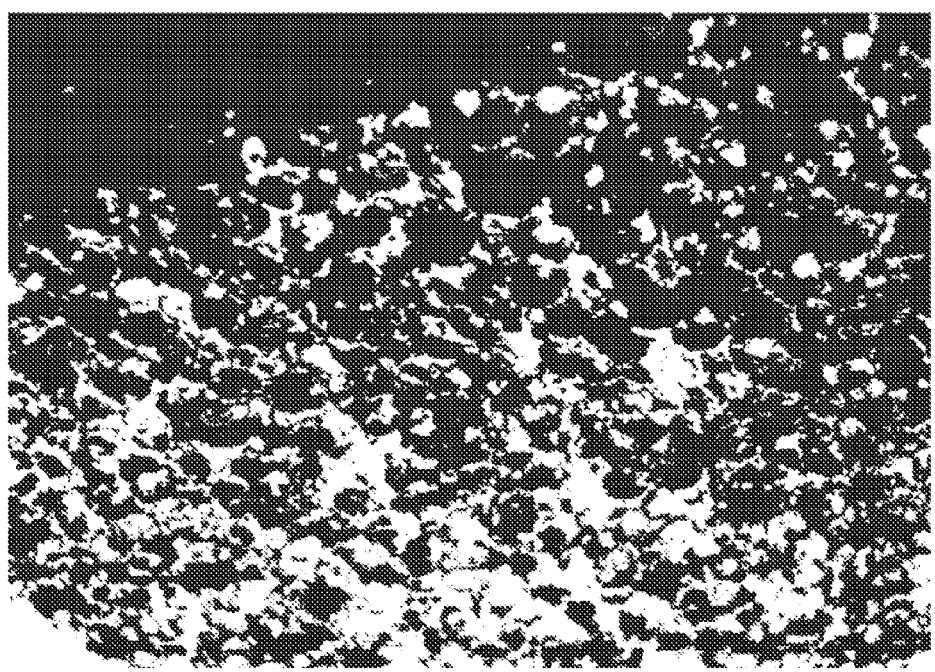
FIG. 9 is a view that shows another example of a porous material that is used in the heat receiving portion of the fourth exemplary embodiment of the present invention.

FIG. 7 is a vertical cross-sectional view that shows a heat receiving portion of a fourth exemplary embodiment of the present invention. In the heat receiving portion of FIG. 7, the same reference symbols are given to the same locations as the heat receiving portion of the second exemplary embodiment shown in FIG. 5A and FIG. 5B, and so overlapping descriptions are omitted. In the present exemplary embodiment, the boiling promotion fins 14 that promote boiling of the refrigerant are formed using a porous material. In the case of using porous fins, the foam amount from the holes increases, and so the heat transmission amount also improves. FIG. 8 shows a magnified view of Full Porous (product name) manufactured by Furukawa-Sky Aluminum Corp. as one example of a porous material. Also, FIG. 9 shows a magnified view of Alporas (product name) manufactured by Shinko Wire Co. as another example. These are both porous materials made of aluminum. These materials can be favorably used for the boiling promotion fins 14.

[Fifth Exemplary Embodiment]

Figure 10:
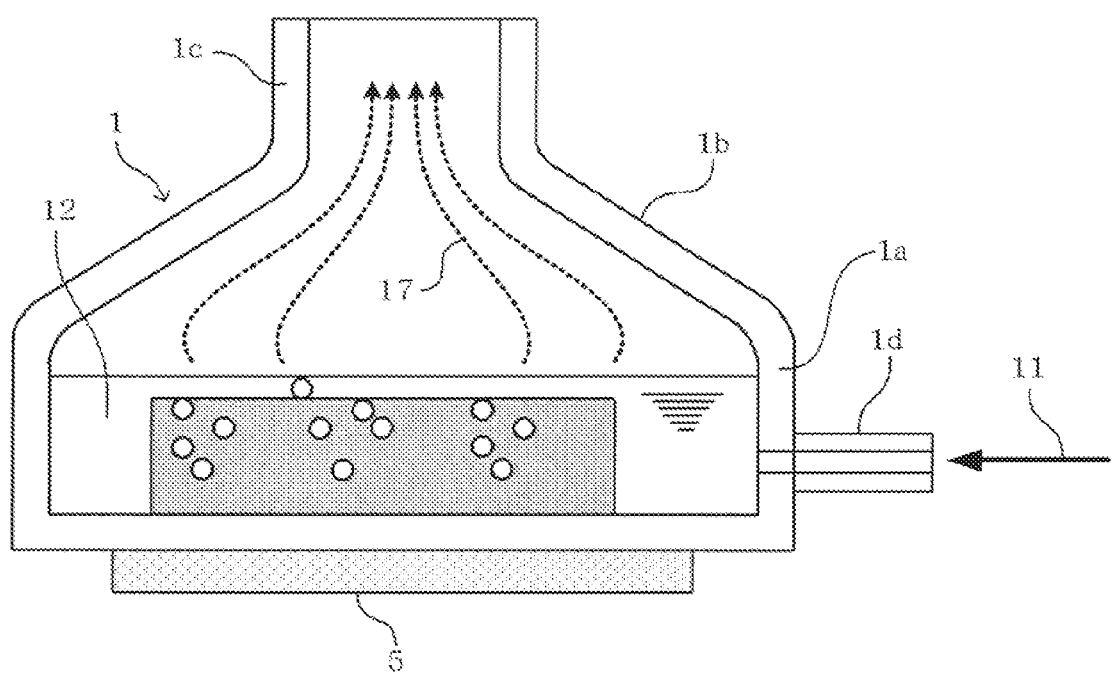
FIG. 10 is a cross-sectional view that shows the heat receiving portion of the fifth exemplary embodiment of the present invention.

FIG. 10 is a vertical cross-sectional view that shows a heat receiving portion of a fifth exemplary embodiment of the present invention. In the heat receiving portion of FIG. 10, the same reference symbols are given to the same locations as the heat receiving portion of the second exemplary embodiment shown in FIG. 5A and FIG. 5B, and so overlapping descriptions are omitted. In the case of the heat receiving portion of the second exemplary embodiment shown in FIG. 5A and FIG. 5B, the connection portion at each portion of the heat receiving portion is abruptly bent at a certain angle. In this case, there is the possibility of pressure loss occurring due to the flow that wraps around the angle not being able to conform to the shape of angle. The present exemplary embodiment addresses this, and as shown in FIG. 10, the main body portion 1a and the cover portion 1b of the heat receiving portion, and the cover portion 1b and the vapor outflow portion 1c are joined so that the angles therebetween draw a smooth line. That is, the connection portion between the main body portion 1a and the cover portion 1b inside of the heat receiving portion 1 is formed with a streamlined form. Also, the connection portion between the cover portion 1b and the vapor outflow portion 1c inside of the heat receiving portion 1 is formed with a streamlined form. By adopting such a shape, sudden changes in the flow are prevented, and so the flow of the vapor becomes smoother, whereby it is possible to minimize flow pressure loss.

[Action of the Exemplary Embodiment of the Present Invention]

According to the boiling heat transfer device of the exemplary embodiments of the present invention, in the heat receiving portion 1, the refrigerant evaporates, and the vapor that occurs from the boiling flows upward in the reverse direction of gravity due to the lift. The vapor tube 2 is connected to the upper portion of the heat receiving portion 1. The refrigerant vapor is sent to the heat dissipating portion (heat exchange portion) 3 through the vapor tube 2 without impairing the momentum of the vapor that is produced by the lift. In the heat dissipating portion 3, heat is removed from the refrigerant, and the refrigerant is liquefied and condensed. The liquid refrigerant that has condensed returns from the bottom of the heat dissipating portion 3 to the liquid refrigerant of the heat receiving portion (boiling portion) 1 through the liquid tube 4.

The outer bottom surface of the heat receiving portion 1 of the boiling heat transfer device of the exemplary embodiments of the present invention is formed in a planar shape, and the boiling surface that is the inner bottom surface thereof is formed in a planar shape. The heat receiving portion 1 is capable of boiling and heat reception by utilizing the entire surface of a semiconductor package. While a conventional heat pipe has a heat receiving structure on the side surface of a circular or oval pipe, the heat receiving structure of the exemplary embodiments of the present invention is capable of transmitting heat in a superior manner. Also, the planar shape heat receiving structure is superior also in terms of constructing a structure that promotes the gas phase change of the refrigerant by efficiently transmitting the heat from the package to the refrigerant.

The boiling bubbles that are produced at the planar boiling surface flow upward with a given speed in the opposite direction to the direction of gravity. As the cross sectional area of the vapor tube (tube) 2 that is connected to the heat dissipating portion 3 is small compared to the area of the boiling surface, it is possible to make the overall size of the boiling cooling device compact. In order to circulate the flow of vapor bubbles that are produced to the vapor tube 2 in an efficient manner, the side walls of the upper portion of the heat receiving portion 1 have the shape of a truncated cone or a truncated pyramid so that the cross-sectional area of the vapor flow passage gradually decreases. For that reason, it is possible to minimize the pressure loss from the boiling surface to the vapor tube 2.

Moreover, the vapor tube 2 is bent from immediately after the connection portion with the heat receiving portion 1 in a lateral direction respect to the direction of gravity, and is sent to the heat dissipating portion (condenser) 3. The heat dissipating portion 3 and the heat receiving portion 1 are installed in a lateral direction with respect to the direction of gravity. Even in the event of condensation having occurred inside of the vapor tube 2, the liquid-state refrigerant is sent to the heat dissipating portion 3 along the flow of the vapor (refer to FIG. 4B), and so it is possible to inhibit its accumulation in the vapor tube 2.

In the heat dissipating portion 3, the portion where the vapor tube 2 reaches by being bent serves as the upper entry, and the condensed liquid phase circulated to the heat receiving portion 1 from the lower portion of the heat dissipating portion 3. At that time, the liquefied refrigerant from the heat dissipating portion 3 is discharged into the liquefied refrigerant in the heat receiving portion (boiling portion) 1. Thereby, mixing of vapor into the liquefied refrigerant that is flowing back is prevented. The liquid-phase return flow to the heat receiving portion 1 from the heat dissipating portion 3 depends on the flow due to gravity. In the boiling heat transfer device of the exemplary embodiments of the present invention, making the difference of elevation small keeps the pressure difference small. Thereby, it is possible to further reduce the pressure loss. As shown in FIG. 1 and FIG. 2, the height of the bottom surface in the heat dissipating portion 3 is slightly higher than the height of the liquid surface of liquefied refrigerant in the heat receiving portion 1. Due to this height difference, return flow of the liquefied refrigerant to the heat receiving portion 1 becomes possible.

[Supplementary Description of Structure and Manufacturing Method]

Next, a supplementary description of the preferred structure of the boiling heat transfer device of the aforementioned exemplary embodiments of the present invention and an outline description of the manufacturing method shall be given.

Figure 11A:
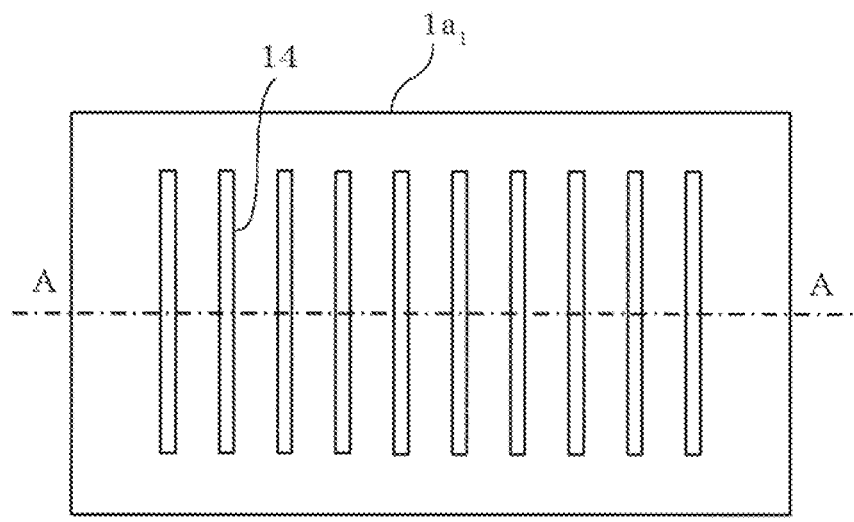
FIG. 11A is a plan view of a bottom plate that has a square shape.
Figure 11B:
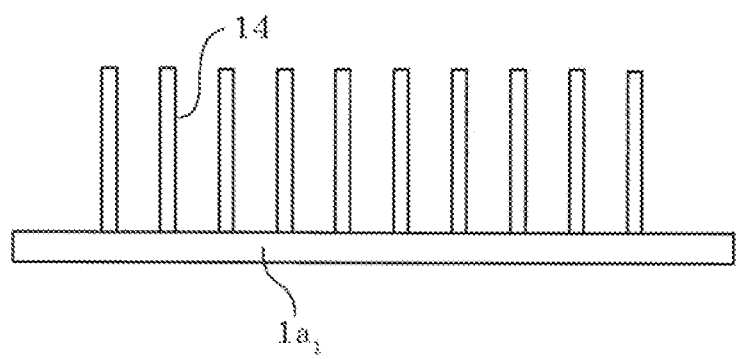
FIG. 11B is a cross-sectional view along line A-A of FIG. 11A.
Figure 11C:
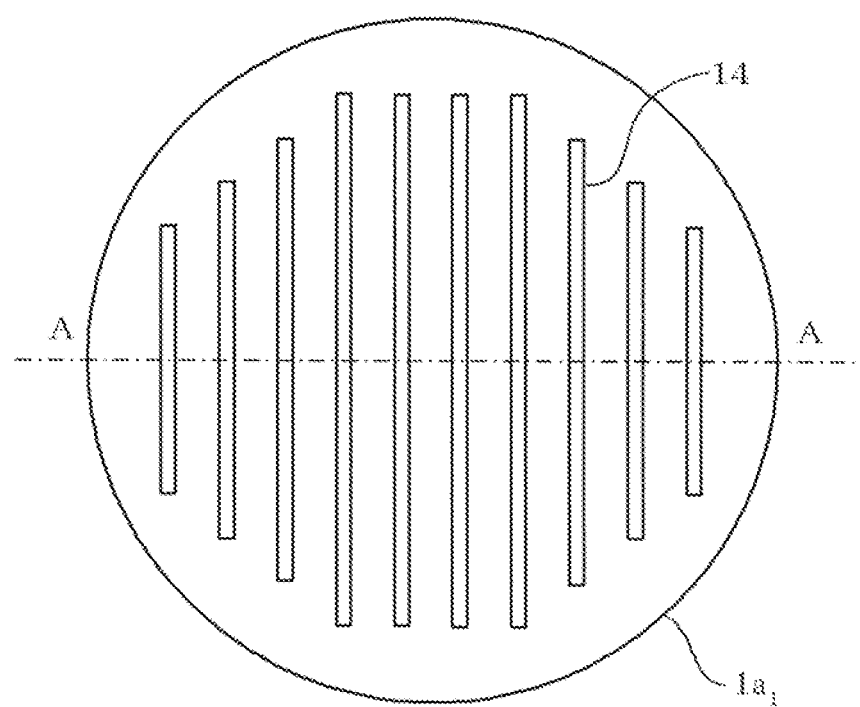
FIG. 11C is a plan view of a bottom plate that has a circular shape.
Figure 11D:
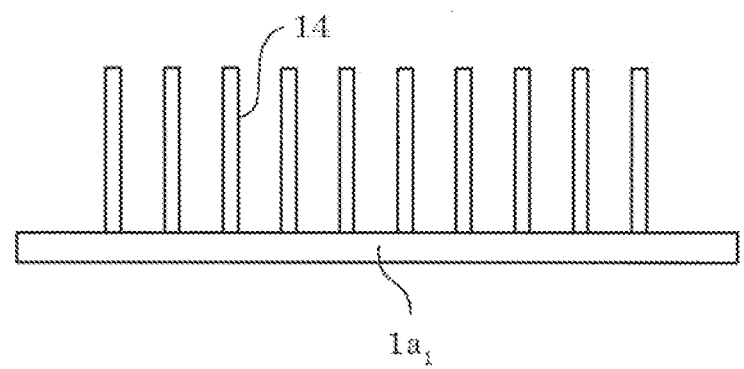
FIG. 11D is a cross-sectional view along line A-A of FIG. 11C.
Figure 12A:
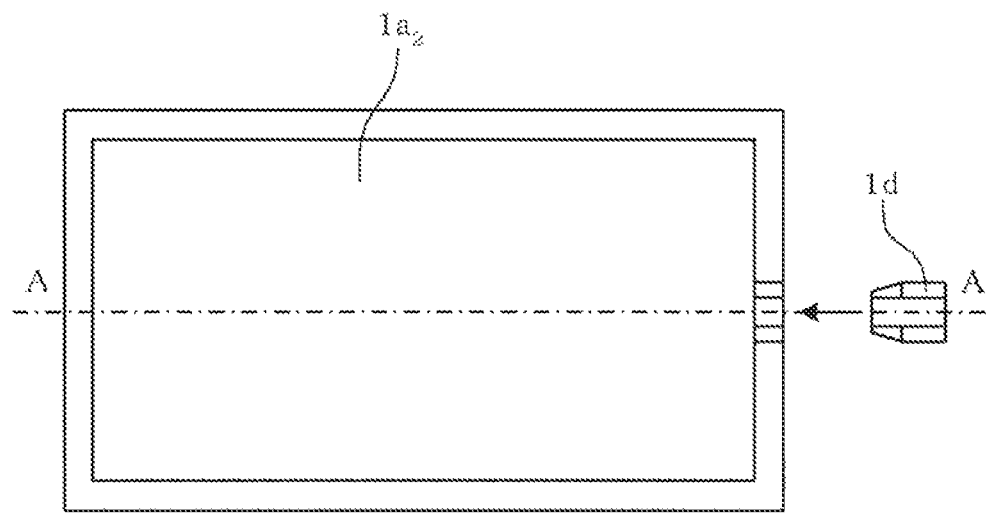
FIG. 12A is a plan view of a side wall portion with a square shape.
Figure 12B:
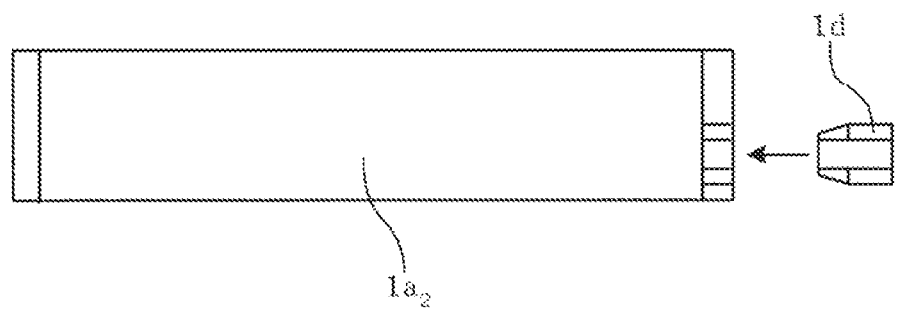
FIG. 12B is a cross-sectional view along line A-A of FIG. 12A.
Figure 12C:
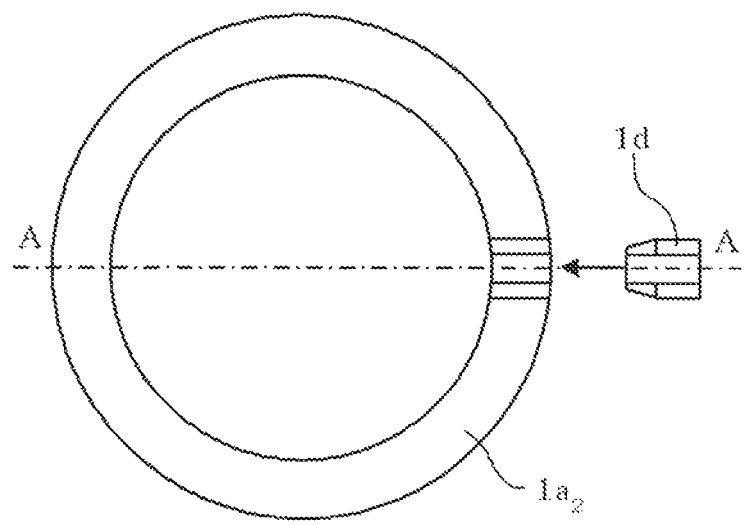
FIG. 12C is a plan view of a side wall portion with a circular shape.
Figure 12D:
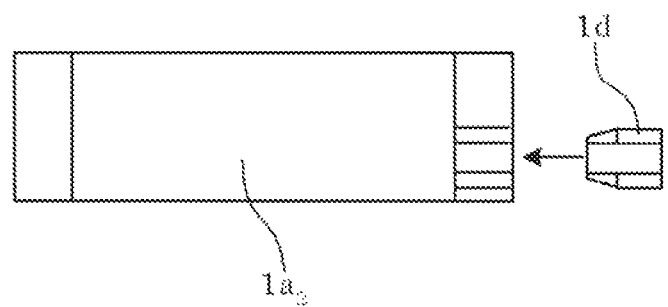
FIG. 12D is a cross-sectional view along line A-A of FIG. 12C.
Figure 13A:
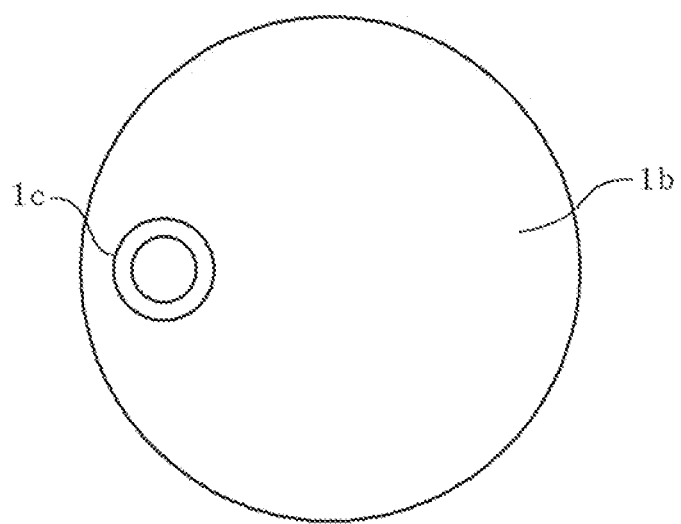
FIG. 13A is a plan view of a cover portion with a circular plate shape.
Figure 13B:
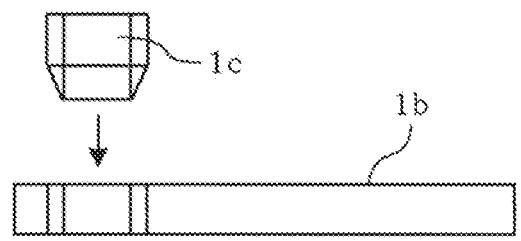
FIG. 13B is a cross-sectional view of the cover portion with the circular plate shape.
Figure 13C:
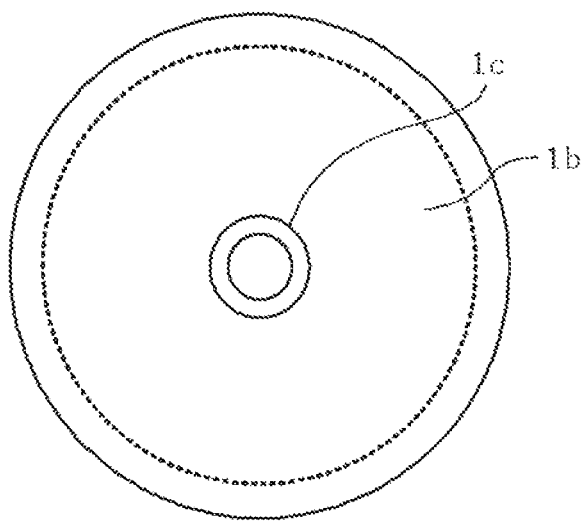
FIG. 13C is a plan view of a cover portion with a truncated cone shape.
Figure 13D:
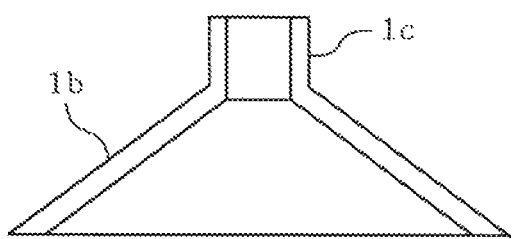
FIG. 13D is a cross-sectional view of the cover portion with the truncated cone shape.

A description shall be given for the heat receiving portion shown in FIG. 2, FIG. 5A, and FIG. 7. The main body portion $1a$ of the heat receiving portion 1 is constituted by a bottom plate $1a_1$ and a side wall portion $1a_2$. FIG. 1 1B is a cross-sectional view along line A-A of FIG. 11A. FIG. 11C is a plan view of the bottom plate $1a_1$ in the case of the bottom plate being round. FIG. 11D is a cross-sectional view along line A-A of FIG. 11C. FIG. 12A is a plan view of the side wall portion $1a_2$ in the case of the side wall portion being square. FIG. 12B is a cross-sectional view along line A-A in FIG. 12A. FIG. 12C is a plan view of the side wall portion $1a_2$ in the case of the side wall portion being round. FIG. 12D is a cross-sectional view along line A-A of FIG. 12C. FIG. 13A and FIG. 13B are a plan view and cross-sectional view, respectively, of the cover portion $1b$ in the case of the cover portion being a circular plate. FIG. 13C and FIG. 13D are a plan view and a cross-sectional view, respectively, of the cover portion $1b$ in the case of the shape of the cover portion having the shape of a truncated cone.

Since the bottom plate $1a_1$ of the heat receiving portion 1 is in contact with the heat generating element 5, it is preferable to use a material with a high thermal conductivity. In particular, as the material of the bottom plate $1a_1$, a general purpose metal having a high thermal conductivity such as copper or aluminum is preferable. It is preferred to use this material to form it in an integrated manner from the surface that is in contact with the heat generating element 5 (lower surface of the bottom plate $1a_1$) to the boiling promotion fins 14 that generate the boiling bubbles. In the boiling promotion fins 14, the first object is to generate boiling bubbles, and so it is necessary to efficiently discharge the vapor while supplying the liquid that is required to always continue the boiling. When an organic refrigerant is used, generally the surface tension is less than water, and so the diameter of bubbles that form at the time of boiling is around 1.0 mm. In such a case, it is not desirable to make the distance between the boiling promotion fins 14 extremely narrow to be less than the bubble diameter, and it is preferable that it be equal to or greater than the bubble diameter. On the other hand, in consideration of the fact that it is possible to also increase the heat discharge amount as the surface area of the boiling promotion fins 14 becomes wider, when the distance between the boiling promotion fins 14 becomes too great, the number of boiling promotion fins 14 that can be formed becomes limited. Moreover, the quantity of heat that passes through the inside of the boiling promotion fins 14 depends on the thickness of the boiling promotion fins 14. The thicker the boiling promotion fins 14, the more heat that flows, but when they are made excessively thick, the heat dissipation surface area is limited. In consideration of these points, the optimal structure of the boiling promotion fins 14 is for the distance between the fins to be 1.0 mm, the fin thickness to be 1.0 to 2.0 mm, and the fin height to be 1.0 to 5.0 mm. In the case of a fin structure with an aspect ratio of around 1:5 in these millimeter scales, manufacturing by machining is one of the favorable methods. When the boiling promotion fins 14 and the bottom plate $1a_1$ in the heat receiving portion 1 are integrally formed, it is possible to reduce the thermal resistance that occurs in the connection portions thereof compared to the case of forming them separately and combining them. FIGS. 11A to 11D show an example of the case of the boiling promotion fins 14 and the bottom plate $1a_1$ being integrally formed.

In the case of forming the boiling promotion fins 14 using the porous material shown in FIG. 7, a method that makes the bottom surface of the bottom plate $1a_1$ smooth, and joins the porous material to the smoothed bottom surface by brazing or the like is preferred. The porous materials that are exemplarily shown in FIG. 8 and FIG. 9 are both made of aluminum, and in this case it is preferable to also use the same aluminum for the bottom plate $1a_1$.

A method of manufacturing the heat receiving portion shall be described using FIG. 12A to FIG. 12D. The side wall portion $1a_2$ is made using a material with high thermal conductivity (copper or aluminum). The condensate inflow portion $1d$, on which a screw thread is formed, is screwed into the side wall portion $1a_2$. Next, the bottom plate $1a_1$ and the side wall portion $1a_2$ are joined by a means such as brazing to form the main body portion $1a$ of the heat receiving portion 1. The cover portion $1b$ shown in FIGS. 13A to 13D that is formed using a material similarly having high thermal conductivity is joined with the main body portion $1a$ by a means such as brazing or the like to form the heat receiving portion 1. As shown in FIG. 13A and FIG. 13B, the vapor outflow portion $1c$, on which a screw thread is formed in advance, is screwed into the cover portion $1b$. Alternatively, the cover portion $1b$ may be integrally formed in advance with the vapor outflow portion $1c$ as shown in FIG. 13C and FIG. 13D. By joining each portion by brazing, it is possible to obtain the heat receiving portion 1 having a sealed structure that is capable of withstanding pressure fluctuations during boiling.

The heat dissipating portion 3 is constituted mainly by a heat dissipating portion header $3a$, a condensate collection portion $3b$, a vapor-condensate cylinder $3c$, and a heat dissipating fin $3d$. This basic structure resembles a radiator that is used in an automobile or the like. However, in the exemplary embodiment of the present invention, since condensation of the refrigerant vapor is performed in addition to the heat dissipation, it is essential to be able to perform efficient heat dissipation in the condensation of the refrigerant. As shown in the cross-sectional view of FIG. 38, connecting the vapor flow inlet $3e$ in a perpendicular manner near the center of the heat dissipating portion header $3a$ is favorable. As a result, the vapor that flows into the heat dissipating portion header $3a$ collides with the wall on the back surface side of the heat dissipating portion header $3a$, and it is possible to cause it to disperse so as to permeate the heat dissipating portion header 3a. Thereby, it is possible to make the pressure inside of the heat dissipating portion header 3a stable, and accordingly it is possible to make the flow rates of the vapor-condensate flow passages 3c' uniform.

From the standpoint of heat dissipation, the narrower that the vapor-condensate cylinder 3c is, the better, but from the standpoint of the flow of the condensed refrigerant, a certain degree of thickness is required. In the exemplary embodiment of the present invention, condensation relies on the liquid phase exclusion capability, which depends on gravity. Ideally, the condensed refrigerant forms a thin-film liquid phase on the inner wall of the flow passage of the vapor-condensate cylinder 3c, and is discharged to the condensate collection portion 3b side by gravity. In rare cases, the vapor becomes bubbles in the condensed liquid phase and becomes trapped, and in such a case, it serves as resistance to the discharge of the liquid phase. In order to avoid such a situation, the flow passage width of the vapor-condensate cylinder 3c should be the minimum. In the case of using an organic refrigerant, the width of the inner surface of the flow passage of the vapor-condensate cylinder 3c is 0.3 mm or more, and from the standpoint of heat dissipation, the width of the inner surface of the flow passage of the vapor-condensate cylinder 3c is preferably 1.0 mm or less.

It is preferable to use a flexible tubing material in the connection between the heat receiving portion 1 and the heat dissipating portion 3. A polymer material has high flexibility, but is also permeable, and so the refrigerant may leak out through the tubing wall surface. In order to realize a flexible connection, use of a material such as butyl rubber which, although it is a polymer, has low permeability, use of a polymer tubing material in which a metallic thin film is laminated, and adoption of a metal tubing material that maintains flexibility with a bellows shape, etc. is favorable.

It is preferable to provide an inflow/outflow nozzle at the positions that connect the tubing to the heat receiving portion 1 and the heat dissipating portion 3, and connect the tubing material to them. Since there is a risk of leakage of the refrigerant through surface boundary of the connection portions and the tubing material, it is preferable to seal the connection portions using an adhesive material.

When the sealing of the connection portions is finished, the refrigerant is poured in through the refrigerant pouring inlet 7, and removal of included air is performed. Removing the air leads to the saturation vapor pressure of the refrigerant inside of the cooler. As one condition of refrigerant selection, the saturation vapor pressure is preferably as close to 1 atm as possible. This because it is necessary to increase the strength of the cooler for one that greatly deviates from 1 atm. For example, Novec, one type of fluorinated refrigerant manufactured by 3M Company, has a boiling point at an atmospheric pressure of 47° C., and a saturation vapor pressure at room temperature of approximately 40 kPa. In consideration of the cooling electronic equipment, the difference from atmospheric pressures at room temperature is not so large, and since during operation it is possible to keep it below 2 atm or less, this refrigerant is favorable in a boiling and cooling apparatus according the exemplary embodiments of the present invention.

Hereinabove, while the invention has been particularly shown and described with reference to exemplary embodiments thereof, the invention is not limited to these embodiments. It will be understood by those of ordinary skill in the art that various changes in form and details may be made therein without departing from the scope of the present invention as defined by the claims.

This application is the National Phase of PCT/JP2009/005577, filed Oct. 22, 2009, which is based upon and claims the benefit of priority from Japanese patent application No. 2008-294282, filed on Nov. 18, 2008, the disclosure of which is incorporated herein in its entirety by reference.

INDUSTRIAL APPLICABILITY

It is possible to apply the present invention to a boiling heat transfer device. According to this boiling heat transfer device, it is possible to achieve a function that suppresses pressure loss of the refrigerant circulation system to a low level while raising the heat dissipation to outside the device to a maximum level.

Reference Symbols
1 Heat receiving portion
1a Main body portion
$1a_1$ Bottom plate
$1a_2$ Side wall portion
1b Cover portion
1c Vapor outflow portion
1d Condensate inflow portion
2 Vapor tube
3 Heat dissipating portion
3a Heat dissipating portion header
3b Condensate collection portion
3c Vapor-condensate cylinder
3c' Vapor-condensate flow passage
3d Heat dissipating fin
3e Vapor flow inlet
3f Condensate outlet
3g Frame
4 Liquid tube
5 Heat generating element
6 Cooling fan
7 Refrigerant pouring inlet
8 Arrow (vapor flow direction)
9 Arrow (liquid flow direction)
10 Vapor (vapor-phase refrigerant)
11 Liquid-phase refrigerant
12 Refrigerant
13 Boiling bubble
14 Boiling promotion fin
15 Vapor flow direction
16 Arrow (liquid flow direction)
17 Arrow (vapor flow direction)

The invention claimed is:
1. A boiling heat transfer device comprising:
a heat receiving portion that boils a liquefied refrigerant to convert it to vapor, and contacts with a device to be cooled and cools the device to be cooled, wherein the heat receiving portion comprises a main body portion and a cover portion, the main body portion comprises a box shape and a bottom plate contacting with the device to be cooled, the cover portion covers the main body portion, and an outer shape of the cover portion is a truncated pyramid;
a vapor tube that connects to an upper portion of the heat receiving portion and conveys the vapor generated by the heat receiving portion;
a heat dissipating portion that condenses the vapor conveyed from the vapor tube to convert it to a liquefied refrigerant and dissipates heat to an atmosphere;
a liquid tube that returns to the heat receiving portion the liquefied refrigerant condensed by the heat dissipating portion; and a plurality of boiling promotion plates provided in the heat receiving portion, wherein each of the boiling promotion plates comprises a porous material made of aluminum, wherein each of the boiling promotion plates comprises a lower end and an upper end, the lower end contacting with the bottom plate of the main body portion, and the upper end is apart from the cover portion and positioned below the cover portion, and wherein at least a portion of a cross-sectional area of a flow passage of the vapor in the heat receiving portion gradually decreases from a lower portion of the heat receiving portion toward the upper portion of the heat receiving portion.

2. The boiling heat transfer device according to claim 1, wherein the vapor tube is drawn out from the heat receiving portion side in a parallel direction to a direction of gravity, and is bent in a direction close to horizontal toward the heat dissipating portion.

3. The boiling heat transfer device according to claim 1, wherein the vapor tube has a first end portion connected with the heat receiving portion and a second end portion connected with the heat dissipating portion, and an orientation of a center axis of the vapor tube is approximately parallel to a direction of gravity in a vicinity of the first end portion and approximately perpendicular to the direction of gravity in a vicinity of the second end portion.

4. A boiling heat transfer device comprising:
a heat receiving portion that boils a liquefied refrigerant to convert it to vapor, and contacts with a device to be cooled and cools the device to be cooled, wherein the heat receiving portion comprises a main body portion and a cover portion, the main body portion comprises a box shape and a bottom plate contacting with the device to be cooled, the cover portion covers the main body portion, and an outer shape of the cover portion is a truncated pyramid;
a vapor tube that conveys the vapor generated by the heat receiving portion;
a heat dissipating portion that condenses the vapor conveyed from the vapor tube to convert it to a liquefied refrigerant and dissipates heat to an atmosphere;
a liquid tube that returns to the heat receiving portion the liquefied refrigerant condensed by the heat dissipating portion; and
a plurality of boiling promotion plates provided in the heat receiving portion, wherein each of the boiling promotion plates comprises a porous material made of aluminum, wherein each of the boiling promotion plates comprises a lower end and an upper end, the lower end contacting with the bottom plate of the main body portion, and the upper end is apart from the cover portion and positioned below the cover portion, and wherein the vapor tube is drawn out from the heat receiving portion side in a parallel direction to a direction of gravity, and bent in a direction close to horizontal toward the heat dissipating portion.

5. The boiling heat transfer device according to claim 3, wherein the vapor tube starts to bend immediately after a connection portion with the heat receiving portion.

6. The boiling heat transfer device according to claim 1, wherein the heat receiving portion and the heat dissipating portion are installed in a lateral direction with respect to a direction of gravity.

7. The boiling heat transfer device according to claim 1, wherein the liquid tube is drawn out from a bottom portion of the heat dissipating portion, and the liquefied refrigerant that passes through the liquid tube is directly returned to the liquefied refrigerant in the heat receiving portion.

8. The boiling heat transfer device according to claim 1, wherein the device to be cooled is disposed in a center portion directly below the heat receiving portion, and the vapor tube opens at an upper center of the heat receiving portion.

9. The boiling heat transfer device according to claim 1, wherein at least one of a connection portion between a vapor outflow portion of the heat receiving portion and a main body portion of the heat receiving portion, and a connection portion between the main body portion of the heat receiving portion and the cover portion of the heat receiving portion is formed in a streamlined shape.

10. The boiling heat transfer device according to claim 1, wherein a nozzle for pouring in refrigerant is provided at an upper side corner portion of the heat dissipating portion.

11. The boiling heat transfer device according to claim 1, wherein the upper end of each of the boiling promotion plates is positioned below a position where the main body portion and the cover portion are joined with each other.

12. The boiling heat transfer device according to claim 1, wherein the vapor tube is connected to the cover portion, and the liquid tube is connected to the main body portion.

13. The boiling heat transfer device according to claim 4, wherein the upper end of each of the boiling promotion plates is positioned below a position where the main body portion and the cover portion are joined with each other.

14. The boiling heat transfer device according to claim 4, wherein the vapor tube is connected to the cover portion, and the liquid tube is connected to the main body portion.

* * * * *